US012802951B2

(12) United States Patent
Mark et al.

(10) Patent No.: US 12,802,951 B2
(45) Date of Patent: Nov. 17, 2026

(54) METHOD FOR MAGNETRON SPUTTERING

(71) Applicant: Melec GmbH, Baden-Baden (DE)

(72) Inventors: Günter Mark, Rheinmünster (DE); Jonathan Löffler, Ottersweier (DE)

( * ) Notice: Subject to any disclaimer, the term of this patent is extended or adjusted under 35 U.S.C. 154(b) by 117 days.

(21) Appl. No.: 18/678,798

(22) Filed: May 30, 2024

(65) Prior Publication Data

US 2024/0404806 A1 Dec. 5, 2024

(30) Foreign Application Priority Data

Jun. 2, 2023 (EP) .................................... 23177063

(51) Int. Cl.
*H01J 37/34* (2006.01)
*H01J 37/24* (2006.01)
*H01J 37/248* (2006.01)

(52) U.S. Cl.
CPC ........ *H01J 37/3405* (2013.01); *H01J 37/241* (2013.01); *H01J 37/248* (2013.01); *H01J 2237/2485* (2013.01)

(58) Field of Classification Search
None
See application file for complete search history.

(56) References Cited

U.S. PATENT DOCUMENTS 6,735,099 B2 * 5/2004 Mark .................. H02M 7/5387 363/63
8,435,389 B2 * 5/2013 Kadlec .............. H01J 37/32944 204/192.12
9,355,824 B2 * 5/2016 Kadlec .............. H01J 37/32944
9,416,440 B2 * 8/2016 Hultman ................. C23C 14/35
10,441,185 B2 * 10/2019 Rogers ................... A61B 5/076
11,560,618 B2 * 1/2023 Raab ........................ C23C 14/08
11,560,627 B2 * 1/2023 Jurczyk ................. C23C 16/513
(Continued)

FOREIGN PATENT DOCUMENTS

GB 2437730 A * 11/2007 ............. C23C 14/35
KR 20100097203 A * 9/2010 .......... H01J 37/3444
(Continued)

OTHER PUBLICATIONS

Holtzer N et al: "Improving Hi PI MS deposition rates by hybrid RF/HiPIMS co-sputtering, and its relevance for NbSi films", Surface and Coatings Technology, Bd. 250 , Seiten 32-36, XP028660042, ISSN: 0257-8972, DOI: 10.1016/J.SURFCOAT.2014.02.007.
(Continued)

*Primary Examiner* — Srinivas Sathiraju
(74) *Attorney, Agent, or Firm* — Welsh Flaxman & Gitler LLC

(57) ABSTRACT

The invention relates to a method for depositing layers on a substrate by means of magnetron sputtering in a deposition chamber with use of at least one magnetron, to which an electrical supply voltage comprising three superimposed electrical excitation forms is applied. The latter comprise a first excitation form, which is formed by a high-frequency voltage with a frequency of 1 MHz to 10 GHz, a second excitation form in the form of high-power impulses (HIPIMS) with a frequency of 100 Hz to 5 kHz, and a third excitation form, formed by a pulsed d.c. voltage or medium-frequency a.c. voltage with a frequency of between 10 kHz and 100 KHz.

15 Claims, 4 Drawing Sheets

(56) References Cited

U.S. PATENT DOCUMENTS

| | | | | |
|---|---|---|---|---|
| 11,694,877 | B2 * | 7/2023 | Kitami | C23C 14/582 118/699 |
| 11,823,859 | B2 * | 11/2023 | Abraham | C23C 14/3485 |
| 11,875,979 | B2 * | 1/2024 | De Bosscher | C23C 14/35 |
| 12,009,192 | B2 * | 6/2024 | Houlahan, Jr. | C23C 14/046 |
| 12,084,755 | B2 * | 9/2024 | Cavarroc | H01J 37/3464 |
| 12,180,579 | B2 * | 12/2024 | Lundin | C23C 14/35 |
| 12,195,857 | B2 * | 1/2025 | Joulia | C23C 14/025 |
| 12,211,679 | B2 * | 1/2025 | Jurczyk | H01J 37/3405 |
| 12,318,299 | B2 * | 6/2025 | Quintana-Ponce | A61L 27/56 |
| 2008/0135400 | A1 * | 6/2008 | Kadlec | H01J 37/32944 204/192.12 |
| 2012/0164051 | A1 * | 6/2012 | Bruns | C23C 14/35 204/192.15 |
| 2013/0220802 | A1 * | 8/2013 | Weichart | H01J 37/32944 204/298.03 |
| 2016/0298764 | A1 * | 10/2016 | Ciminelli Duarte De Souza | F16J 9/26 |
| 2017/0175253 | A1 * | 6/2017 | Chistyakov | C23C 14/0057 |
| 2017/0268122 | A1 * | 9/2017 | Kim | C23C 14/06 |
| 2017/0309459 | A1 * | 10/2017 | Tsukamoto | C23C 14/3485 |
| 2018/0342379 | A1 * | 11/2018 | Jurczyk | H01J 37/32449 |
| 2018/0358213 | A1 * | 12/2018 | Ruzic | H01J 37/3467 |
| 2019/0127842 | A1 * | 5/2019 | Babayan | C23C 14/0605 |
| 2019/0256969 | A1 * | 8/2019 | Chistyakov | C23C 14/0057 |
| 2020/0048760 | A1 * | 2/2020 | Kalathiparambil | C23C 14/35 |
| 2020/0090906 | A1 * | 3/2020 | De Bosscher | C23C 14/35 |
| 2020/0273684 | A1 * | 8/2020 | Jurczyk | H01J 37/3405 |
| 2020/0299823 | A1 * | 9/2020 | Raab | C23C 14/0641 |
| 2020/0377995 | A1 * | 12/2020 | Houlahan, Jr. | C23C 14/3485 |
| 2020/0388474 | A1 * | 12/2020 | Weichart | H01J 37/3405 |
| 2020/0411295 | A1 * | 12/2020 | Kitami | H01J 37/32357 |
| 2021/0040596 | A1 * | 2/2021 | Schüngel | C23C 14/0078 |
| 2021/0050192 | A1 * | 2/2021 | Gaedike | C23C 14/3485 |
| 2021/0115552 | A1 * | 4/2021 | Abraham | C23C 14/0057 |
| 2021/0115553 | A1 * | 4/2021 | Abraham | H01J 37/3452 |
| 2021/0134571 | A1 * | 5/2021 | Bellido-Gonzalez | C23C 14/3485 |
| 2021/0317569 | A1 * | 10/2021 | Abraham | C23C 14/0057 |
| 2021/0327694 | A1 * | 10/2021 | Houlahan, Jr. | C23C 14/352 |
| 2022/0042168 | A1 * | 2/2022 | Abraham | C23C 14/35 |
| 2022/0130641 | A1 * | 4/2022 | Gees | C23C 14/5846 |
| 2022/0230859 | A1 * | 7/2022 | Houlahan, Jr. | H01J 37/3405 |
| 2022/0325417 | A1 * | 10/2022 | Joulia | C23C 4/134 |
| 2022/0349042 | A1 * | 11/2022 | Cavarroc | H01J 37/3464 |
| 2023/0005724 | A1 * | 1/2023 | Abraham | H01J 37/3435 |
| 2023/0149856 | A1 * | 5/2023 | Siria | A61M 1/1678 204/535 |
| 2023/0151476 | A1 * | 5/2023 | Lundin | C23C 14/35 204/192.13 |
| 2023/0160067 | A1 * | 5/2023 | Jurczyk | C23C 16/515 118/723 VE |
| 2023/0360898 | A1 * | 11/2023 | Stubbers | H01J 37/3444 |
| 2024/0011144 | A1 * | 1/2024 | Van Der Folk | C23C 14/0605 |
| 2024/0136156 | A1 * | 4/2024 | Voser | H01J 37/342 |
| 2024/0186064 | A1 * | 6/2024 | Falub | B32B 15/04 |
| 2024/0339280 | A1 * | 10/2024 | Plaza Fernandez | H01J 1/13 |
| 2024/0404806 | A1 * | 12/2024 | Mark | C23C 14/3485 |
| 2025/0084526 | A1 * | 3/2025 | Strämke | C23C 14/0036 |
| 2026/0005004 | A1 * | 1/2026 | Jurczyk | H01J 37/3405 |

FOREIGN PATENT DOCUMENTS

| | | | | |
|---|---|---|---|---|
| WO | 2010/127845 | A1 | 11/2010 | |
| WO | WO-2022159633 | A1 * | 7/2022 | H01J 37/345 |

OTHER PUBLICATIONS

Oskirko VO et al: "Hybrid HIPIMS+MFMS power supply for dual magnetron sputtering systems", Vacuum, Pergamon Press, GB, Bd. 181, Jul. 29, 2020 (Jul. 29, 2020), XP086282676, ISSN: 0042-207X, DOI: 10.1016/J.VACUUM.2020.109670 [gefunden am Jul. 29, 2020].

Chang Chi-Lung et al: "Effect of insert mid-frequency pulses on I-V characterisation, deposition rates and properties of nc-WC/a-C:H films prepared by superimposed HiPIMS process", Surface and Coatings Technology, Elsevier, NL, Bd. 350, Mar. 15, 2018 (Mar. 15, 2018), Seiten 977-984, XP085445433, ISSN: 0257-8972, DOI: 10.1016/J.SURFCOAT.2018.03.042.

Olejnicek J et al: "Investigation of reactive HiPIMS+MF sputtering of TiO2crystalline thin films", Surface and Coatings Technology, Bd. 232 , Seiten 376-383, XP028707102, ISSN: 0257-8972, DOI: 10.1016/J.SURFCOAT.2013.05.038.

Yang Fu-Chi et al: "Effect of mid-frequency pulse insertion on the microstructural and mechanical properties of AlTiN coatings prepared using superimposed HiPIMS process", Surface and Coatings Technology, Elsevier, NL, Bd. 388, Mar. 7, 2020 (Mar. 7, 2020), XP086096549, ISSN: 0257-8972, DOI: 10.1016/J.SURFCOAT.2020.125597 [gefunden am Mar. 7, 2020].

* cited by examiner

METHOD FOR MAGNETRON SPUTTERING

BACKGROUND OF THE INVENTION

Field of the Invention

This invention relates to a method for depositing layers on a substrate by means of magnetron sputtering in a deposition chamber with use of at least one magnetron. Magnetron sputtering is well known for depositing layers, wherein the goal is always to achieve a high deposition rate and to ensure good and reproducible process control.

SUMMARY OF THE INVENTION

It is an objective of this invention to improve the method for depositing layers on a substrate by means of magnetron sputtering in order to achieve a higher deposition rate under reproducible process conditions.

This object is achieved with a method for depositing layers on a substrate by magnetron sputtering in a deposition chamber with use of at least one magnetron, to which an electrical supply voltage comprising three superimposed electrical excitation forms is applied. The method comprises a first excitation form, which is formed by a high frequency voltage with a frequency of 1 MHz to 10 GHz, a second excitation form in the form of high-power impulses (HIPIMS) with a frequency of 100 Hz to 5 kHz, and a third excitation form, formed by a pulsed d.c. voltage or a.c. voltage with a frequency of between 10 kHz and 100 kHz. This object is also achieved with a magnetron sputtering unit for depositing layers on a substrate. The magnetron sputtering unit comprises a deposition chamber, a substrate holder, and at least one magnetron arranged in the deposition chamber, which is connected to at least one power supply, whose output emits three excitation forms to the at least one magnetron. A first excitation form is formed by a high-frequency voltage with a frequency of 1 MHz to 10 GHz, a second excitation form is formed by high-power impulses (HIPIMS) with a frequency of 100 Hz to 5 kHz, and a third excitation form is formed by a pulsed d.c. voltage or a.c. voltage with a frequency of between 10 kHz and 100 kHz. Advantageous further developments of the invention are the subject matter of the assigned dependent claims. Advantageous further developments of the invention are also disclosed in the description as well as in the drawings.

According to the invention, at least one magnetron, to which an electrical supply voltage is applied and which has three superimposed electrical excitation forms, namely a high-frequency (RF) voltage with a frequency of 1 MHz to 10 GHz, a second excitation form in the form of high-power impulses (HIPIMS) with a frequency of between 100 Hz and 5 kHz, and a third excitation form, formed by a pulsed d.c. voltage or a.c. voltage with a frequency of between 10 KHz and 100 kHz, is used in the method. It has been pointed out that the superimposed excitation of the magnetron with the above-described three excitation forms results in an extremely high ionization in the plasma and in good ablation of the cathodes, which results in higher deposition rates, a better coating adhesion, and harder coatings as well as denser thin-layer films on the substrate with adjustable properties.

In particular, defect-free layers can be produced, which is important primarily in the case of highly-insulating layers, since there the development of electrically-conductive inclusions in the so-called pin-holes that can make the insulating layer unusable is to be avoided. This is possible because of a specific simultaneous application of the three excitation forms, so that in particular, defect-free highly-insulating layers, e.g., $Al_2O_3$ layers, can be produced by the invention.

The only thing that is important is that the magnetron be simultaneously exposed to all three excitation forms. The three excitation forms can be provided via separate generators or power supplies or via a common power supply that is able to generate or supply all three excitation forms.

In principle, a time synchronization of the three excitation forms is not necessary but it has proven advantageous when at least two of the three excitation forms, preferably all three excitation forms, are fed in a time-synchronized manner. This results in a higher ionization and thus in a greater ablation of the target cathodes and in a better process stability and reproducibility of the results.

Preferably, the high-power impulses (HIPIMS) have a pulse length of more than 10 μs and a pulse power of between 15 kW and 10 MW. In this way, a high power can be introduced into the plasma, which results in a high ionization and in correspondingly high ablation rates of the target cathodes.

A substrate carrier arranged in the deposition chamber is preferably exposed to an electrical bias signal, which improves the deposition of the atoms of the target cathodes, present in the plasma, on the substrate, although the method also works when the substrate holder is not exposed to a bias signal.

Preferably, the bias signal is synchronized with at least one of the three excitation forms of the magnetron. Thus, for example, a pulse signal can always be added to the substrate holder with a brief time offset behind the HIPIMS pulse of the excitation form. The purpose of the time offset is to ensure that as much as possible, only metal ions of the target but not the gas ions of the inert process gas (e.g., Ar) are implanted in the substrate.

In general, a DC signal, a high-frequency signal, and/or a pulse signal can be used as a bias signal. The aim is always to improve the migration or the acceleration of the ions from the plasma in the direction toward the substrate holder by the bias exposure of the substrate holder.

In principle, in the method, a single magnetron or multiple magnetrons, for example a dual magnetron, can be used. If a single magnetron is used, the reference potential for all three excitation forms is preferably the ground potential. If a dual magnetron is used, the cathode of the other magnetron is preferably used as a reference potential.

It goes without saying that the deposition chamber is always on the ground potential and that the reference potential for the bias voltage exposure of the substrate holder is also the ground potential.

In one embodiment of the invention, which results in especially high ionization rates in the plasma and in correspondingly high deposition rates in the case of HIPIMS signals of the second excitation form, short pre-pulses are emitted before the high-power impulses in order to increase the ionization in the deposition chamber. It has turned out that this impulse form results in a repeated improvement of the ionization in the plasma in the deposition chamber.

For magnetron sputtering, it goes without saying that the deposition chamber is kept largely under vacuum and is flooded with a sputtering gas, such as argon or, e.g., nitrogen, which is known in the art and is therefore not further explained here.

The invention also relates to a magnetron sputtering unit for depositing layers on a substrate, comprising a deposition chamber, a substrate holder, and at least one magnetron arranged in the deposition chamber, which is connected to at least one power supply, whose output emits three excitation forms to the at least one magnetron, comprising a first excitation form that is formed by a high-frequency voltage with a frequency of 1 MHz to 10 GHz, a second excitation form that is formed by high-power impulses (HIPIMS) with a frequency of 100 Hz to 5 kHz, and a third excitation form, formed by a pulsed d.c. voltage or a.c. voltage with a frequency of between 10 kHz and 100 kHz. With respect to the mechanism of action and the advantages of superimposing the excitation forms, reference is made further above to the description of the method. It also goes without saying here that the pressure in the deposition chamber is much lower than the normal pressure and that the deposition chamber is flooded with a sputtering gas, such as, for example, argon or nitrogen, wherein the flooding of the deposition chamber with a sputtering gas is controlled in general by a mass flow regulator. In this way, the amount of the sputtering gas and a reactive gas fed to the deposition chamber can be regulated. As set values, signals from measuring devices known in the art, such as, for example, an optical emission spectrometer or a lambda probe, can be used, which devices are able to display at least one process parameter for controlling the method, for example the amount of reactive gas in the process. Preferably, therefore, the deposition chamber is also connected to an optical emission spectrometer (OES), which is used to provide wavelength information, which gives details on the intensity and the degree of ionization of the plasma. In addition to plasma diagnostics, the optical emission spectrometer can also be used for process control.

Optionally, the cathodes of the magnetron are surrounded with a circular anode that is electively switchable, and thus the distribution of plasma in the inside space of the deposition chamber can be affected in addition.

In general, it can be stated that in the case of the cathode sputtering or else a sputtering process, heavy gas ions, such as, for example, argon, are used in order to erode a cathode (target) of the magnetron. This ablated material then in an ionized way goes into the plasma contained in the deposition chamber and condenses on the substrate. During magnetron sputtering, these ions are generated by a gas discharge. To this end, a high d.c. or a.c. voltage and also high-power impulses between cathodes and anodes are generated, the latter in most cases being connected to the chamber material, i.e., grounded. The entire process takes place under high vacuum, so that the collision processes can proceed unhindered and in order to reduce possible contaminants. Magnets arranged behind the cathodes of the magnetron ensure that existing free electrons in the plasma are placed close to the cathode surface. This considerably increases the collision rate with the sputtering gas atoms, for example argon, and thus also increases the deposition rate. The positively-charged sputtering gas ions resulting by collision between the free electrons and the sputtering gas atoms are accelerated on the negatively-charged target surface of the magnetron. This high-power collision with the cathodes results in that atoms of the cathode material are ejected, in order to then move in the direction toward the substrate.

During magnetron sputtering, a distinction is made between single magnetron sputtering and dual magnetron sputtering. In the former, a high d.c. or a.c. voltage is applied between a single cathode and anode by means of a power supply. In this connection, in most cases, the anode is connected to the chamber material. In the process of dual magnetron sputtering, a high a.c. voltage is applied between two magnetrons by means of at least one power supply. For the positive half-wave, the first magnetron A forms the cathode, while the second magnetron B is used as an anode, while it is reversed in the case of the negative half-wave.

If, in addition, a high frequency is superimposed, in the case of any cathode, a high-frequency generator is thus connected between the cathode and the chamber material.

Dual magnetrons are used in particular when in addition to the sputtering gas, a reactive gas, such as, for example, oxygen, is introduced into the deposition chamber.

The advantage of the dual magnetron relative to the single magnetron is that no explicit anode is required. In the case of the single cathode of the single magnetron, it results during the process that the anode is increasingly coated with the non-electrically-conductive product that consists of target material (material of the target cathode of the magnetron) and reactive gas. In this connection, the anode surface is effectively always smaller, and as a result, it can thus even result in the complete failure of the process (disappearing anode problem). Since, in the case of the dual magnetron, the cathode constantly alternately takes on the role of anode, a cathode is always purified during the sputtering phase.

The magnetron sputtering unit preferably contains a synchronization system for synchronizing at least two of the three excitation forms, which are fed to the magnetron, i.e., a single magnetron or a dual magnetron. In this way, the process can be better controlled, and better and reproducible deposition rates are obtained.

Preferably, the substrate holder is isolated relative to the deposition chamber and is connected to at least one BIAS power supply, which is able to expose the substrate holder and thus the substrate to a d.c. voltage, a high-frequency voltage, or a pulse signal in order to improve the deposition of atoms, driven out of the target, on the substrate. Preferably, in this connection, the synchronization system is designed to synchronize the BIAS power supply with at least one power supply of the three excitation forms of the magnetron, and thus the deposition can be considerably improved.

The BIAS power supply is thus preferably designed to emit the following output voltages to the substrate holder: d.c. voltage, high-frequency a.c. voltage with a frequency of 1 MHz to 10 GHz, and/or high-power impulses with a frequency of 10 kHz to 200 kHz.

Preferably, the magnetron sputtering unit has high-frequency filters, since in this invention, a high-frequency generator is operated in parallel with a HIPIMS/medium-frequency generator. This effectively prevents the high frequency, for example 14 MHz, used in the process, as well as its harmonics, from being coupled into the conduit cable of the HIPIMS/medium-frequency generator or its electronics. Without filters, high frequency could be emitted into the free space via the cable. High-frequency currents flowing in an uncontrolled manner can damage the machines and the magnetron sputtering unit.

Finally, adaptive networks are also used, as it is explained in connection with the subsequent description, in order to adapt the impedance of the high-frequency generator to the load impedance in the plasma. This network, called short matchbox, adapts the input impedance of the load, i.e., of the plasma, to the output impedance of the source, i.e., the high-frequency generator. This reduces the reflected power to a minimum and thus ensures that the maximum possible high-frequency power is transmitted from the high-frequency generator into the plasma, which results in a more efficient sputtering process.

The following terms are used synonymously: cathode ray sputtering-sputtering; target cathode-cathode of the magnetron; synchronization system-control.

BRIEF DESCRIPTION OF THE DRAWINGS

The invention is described below, for example, based on the schematic drawing. In the latter.

DESCRIPTION OF THE PREFERRED EMBODIMENTS

Figure 1:
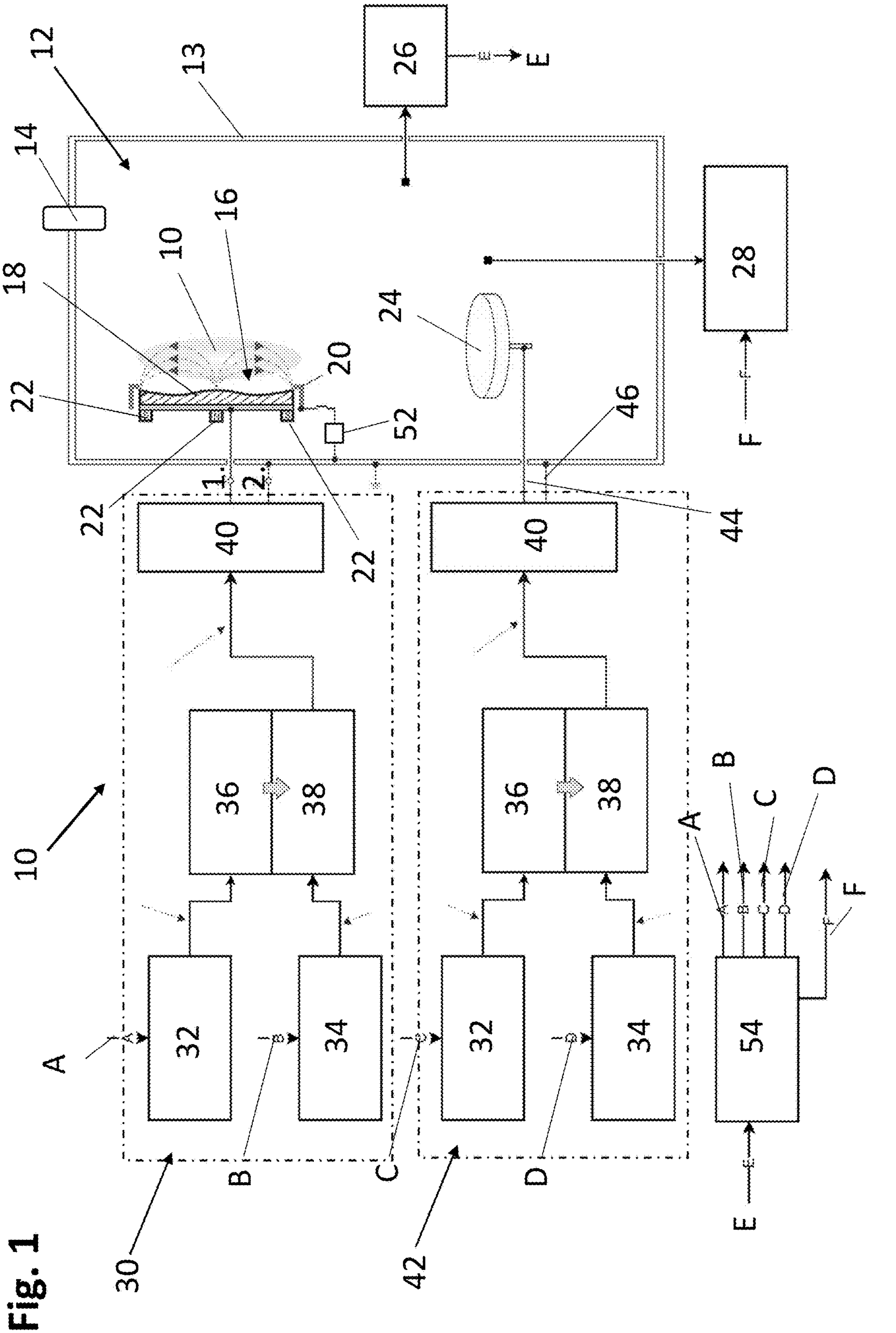
FIG. 1 shows a principal circuit diagram of a magnetron sputtering unit with a single magnetron.

FIG. 1 shows a magnetron sputtering unit 10 with a deposition chamber 12 that is under high vacuum and that has a sputtering gas and reactive gas feed 14. Arranged in the deposition chamber 12 is a magnetron 16, which comprises a target cathode 18 that is flat, circular, or another shape and that is surrounded by a ring anode 20. Magnets 22 of the magnetron are arranged on the back side of the cathode 18, in order to conduct the ions located in the plasma on a spiral track by the interaction with the magnetic field directed perpendicularly to the magnetic induction, which results in an increased number of collisions with the atoms of the sputtering gas or reactive gas. Arranged in the deposition chamber 12 in addition is a substrate holder 24 as well as the sensor system of an optical emission spectrometer (OEM) 26 and a mass flow regulator 28. The cathode 18 of the magnetron 16 is connected to a power supply 30, which has the following components: a DC or pulse generator 32, a high-frequency generator 34, a high-frequency filter 36, an adaptive network 38, and a measuring system 40. The adaptive network 38 is provided in order to adapt the high-frequency voltage of the high-frequency generator 34 to the load impedance of the plasma 17 that is present in the deposition chamber 12. In this way, an effective introduction of power of the high-frequency voltage into the plasma is ensured. The DC/pulse generator 32 goes via a high-frequency filter 36 to the adaptive network 38, and thus the high-frequency voltage produced by the high-frequency generator 34 is prevented from being coupled into the components of the DC/pulse generator or emitted. The excitation forms of the DC/pulse generator are high-power impulses, HIPIMS, and a medium-frequency signal in the range of 10 to 100 kHz, which is applied to the cathode 18 of the magnetron 16. These two excitation forms are superimposed with the high-frequency voltage from the high-frequency generator 34, so that three excitation forms are superimposed on the cathode 18 of the magnetron 16, which excitation forms result, on the one hand, in a high ionization of the plasma and in an improvement of the erosion of the cathode material and thus ultimately in a better deposition on the substrate located in the substrate holder 24.

The measuring system 40 registers the excitation forms that are produced by the two voltage supplies, DC/pulse generator 32, and high-frequency generator 34 for monitoring and displaying and controlling the unit. The substrate holder 24 is connected to a BIAS power supply 42, which is composed in the same way as the power supply 30 for the magnetron 16. Unlike the power supply 30 of the magnetron 16, the DC/pulse generator 32 of the BIAS power supply produces here only a d.c. voltage, a medium frequency, or a pulse frequency, and not a medium frequency and a pulse frequency like the DC/pulse generator in the power supply 30 of the magnetron 16. While a first connector 44 of the BIAS power supply 42 is electrically connected to the substrate holder 24, the second connector 46 is on the housing of the deposition chamber 12 and thus grounded.

In the case of the power supply 30 for the magnetron 16, a first connector 1 is applied to the cathode, while the second connector 2 is on the housing of the deposition chamber and is thus grounded. The ring anode 20, which surrounds the cathode 18 of the magnetron 16, is on the housing of the deposition chamber 12 and thus can be grounded via a switch 52. The closing of this switch connects the anode ring 20 to the ground and thus to the other connector 2 of the power supply, which in turn has effects on the plasma before the cathode.

Finally, the magnetron sputtering unit 10 contains a synchronization system 54, which as input signals and as control parameters obtains the information of the optical emission spectrometer, in other words wavelength information, intensity, and degree of ionization of the sputtering particles in the plasma, and via the outputs A, B, C, D regulates the two DC/pulse generators and high-frequency generators of the power supply 30 for the magnetron and the BIAS power supply 42 for the substrate holder as well as the mass flow regulator 28 for adjusting the desired sputtering-gas or reactive-gas current via the inlet 14.

Figure 2:
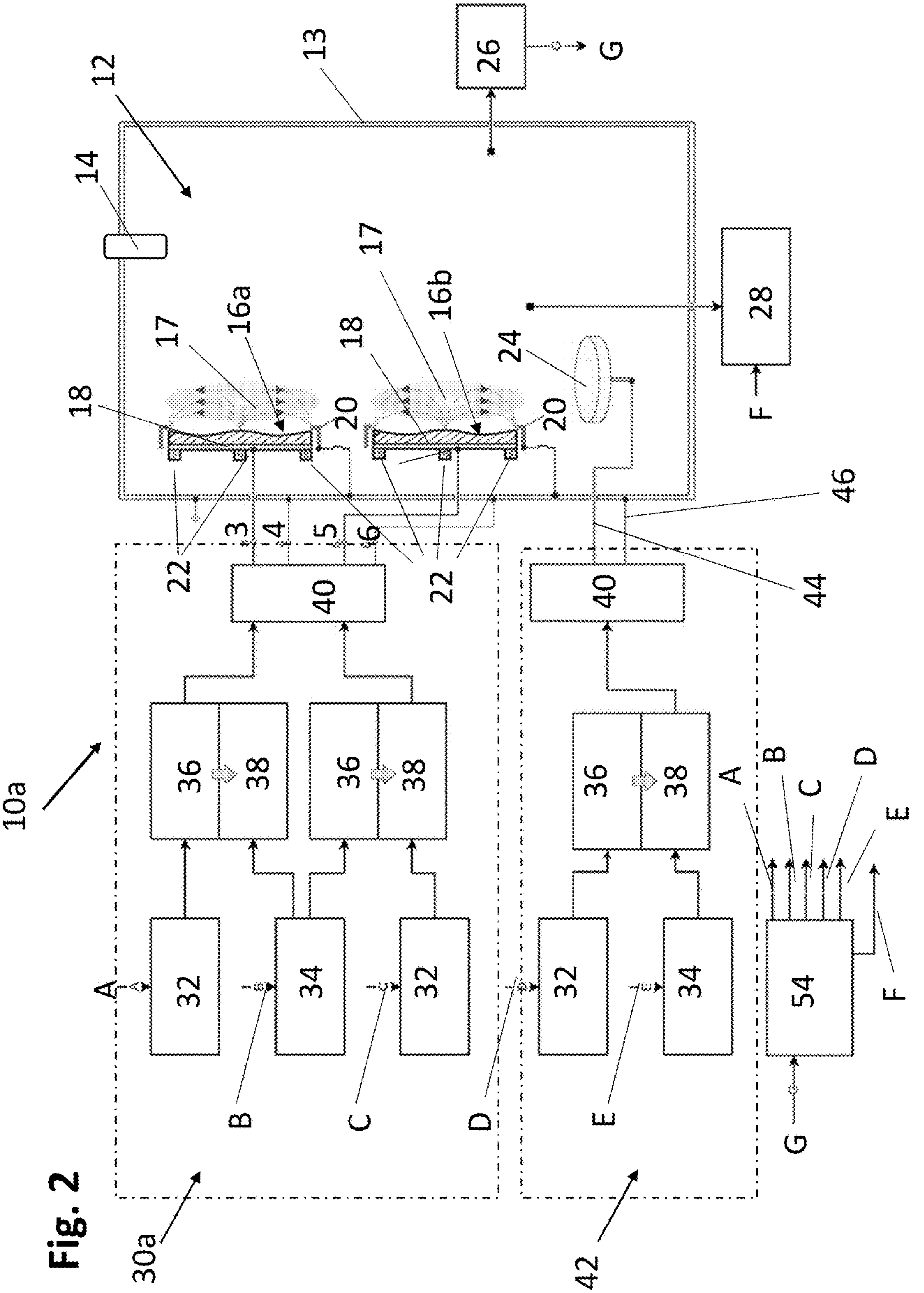
FIG. 2 shows a principal circuit diagram of a magnetron sputtering unit with a dual magnetron.

FIG. 2 shows a magnetron sputtering unit 10*a*, which is designed generally identical to the magnetron sputtering unit 10 of FIG. 1, with the difference that this magnetron sputtering unit 10*a* of FIG. 2 contains two magnetrons 16*a*, 16*b*. This is thus a dual-magnetron system. In FIG. 1, identical or analogous parts are in this connection provided with identical reference numbers. The first connectors 3 and 5 of the output of the power supply 30*a* are connected to the two cathodes 18*a*, 18*b*. The second connectors 4 and 6 of the power supply 30*a* are connected to the housing 13 of the deposition chamber and thus are grounded or run to ground on the material.

The power supply 30*a* for the two magnetrons 16*a* and 16*b* is thus distinguished from the power supply 30 of FIG. 1 in that in this power supply, a first high-frequency generator 32*a* is designed for the first magnetron 16*a* and a second high-frequency generator 32*b* is designed for the magnetron 16*b*, while the DC/pulse generator 34 supplies both magnetrons 16*a*, 16*b*. In the case of this dual-magnetron system 10*a*, the reference potential for the two magnetron cathodes 18*a*, 18*b* is preferably not the ground potential or the housing of the deposition chamber 12, but rather in each case the cathode 18*b*, 18*a* of the other magnetron 16*b*, 16*a*.

Figure 3:
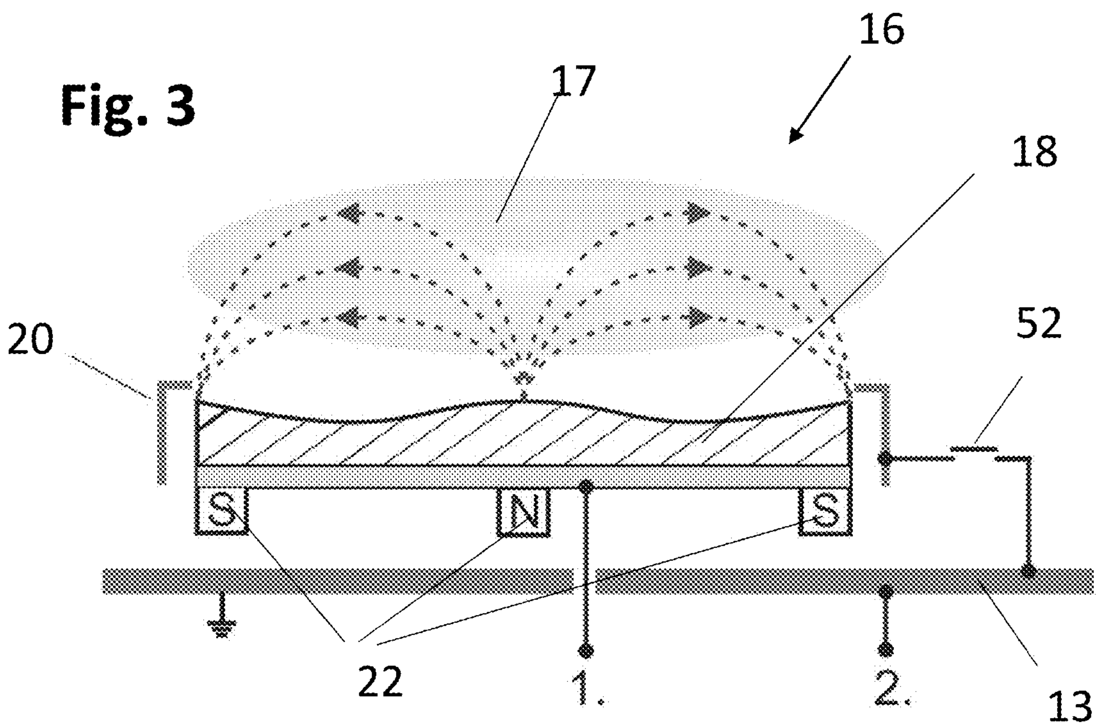
FIG. 3 shows the principal design of the cathode and anode of the single magnetron of FIG. 1.

FIG. 3 depicts a magnified arrangement of the magnetron 16 of FIG. 1. The connectors 1 and 2 from the power supply 30 are applied, on the one hand, to the cathode 18 of the magnetron 16 and, on the other hand, to the housing 13 of the deposition chamber 12. Via the switch 52, the anode ring 20 of the magnetron 16 can also be applied to the material, which has effects on the orientation of the plasma 17. In the drawing, the magnetic field lines between the magnets 22 on the back side of the cathode are depicted with broken lines and arrows.

Figure 4:
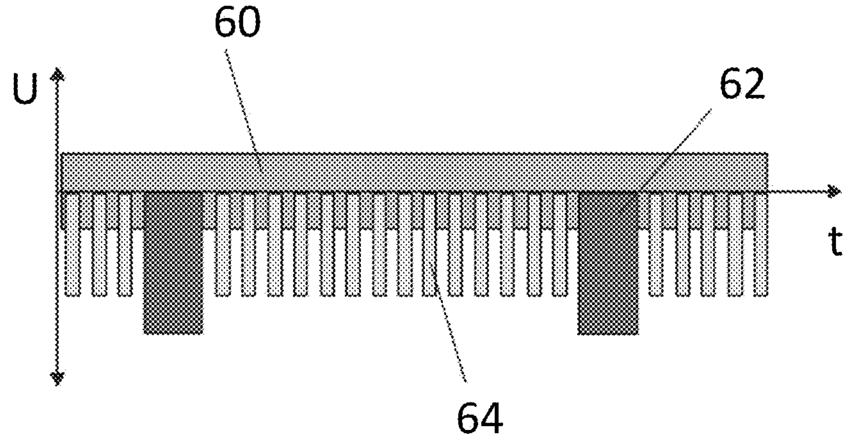
FIG. 4 shows a time-voltage diagram on the superimposed excitation forms emitted to the cathode according to FIG. 3.

FIG. 4 shows the path of the voltage U over time t (in μs) of the magnetron sputtering unit 10 of FIG. 1. In this case, all three excitation forms, namely a high-frequency signal 60, a HIPIMS signal 62, and a medium-frequency signal 64 are depicted as the three excitation forms for the operation of the magnetron. The three excitation forms 60, 62, and 64 are not synchronized, so that they all overlap in time.

Figure 5:
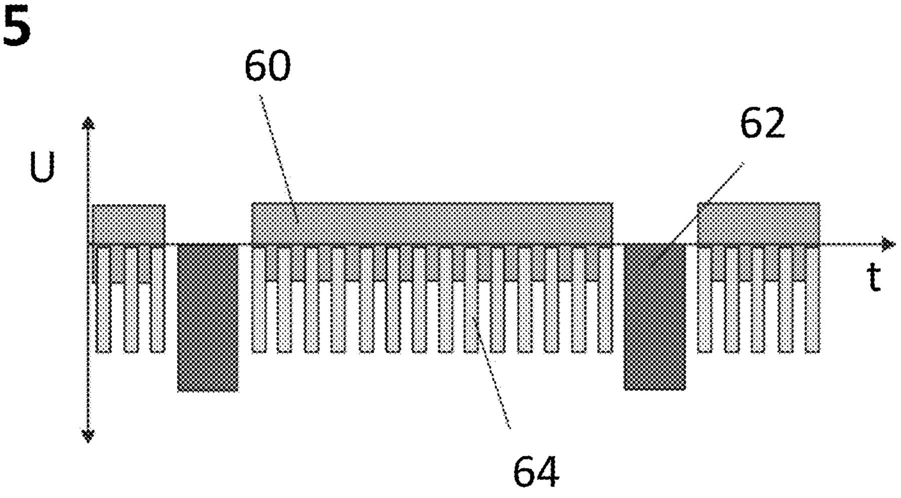
FIG. 5 shows a diagram according to FIG. 4 with time-synchronized excitation forms.

In contrast to this, FIG. 5 shows a voltage/time diagram, in which a synchronization takes place via the synchronization system 54 to the extent that during the feeding of the HIPIMS pulse 62, the feeding of the high-frequency signal 60 and also the medium-frequency signal 64 is interrupted.

In a specific case, an aluminum oxide ($Al_2O_3$) test coating was placed on a silicon wafer with the following parameters: Hipims 62 with a frequency of 704 Hz (20 μs on/1,400 μs off) of a voltage level of 700 V peak to peak with an averaged power of 1,000 W. In the pause times of the Hipims pulses, a medium frequency 64 with a voltage level of 700 V peak to peak was underlaid with a frequency of 10 kHz at an averaged power of 500 W. A high-frequency excitation form with a frequency of 13.65 MHz with a voltage level of 270 V peak to peak and an averaged power of 1,000 W was superimposed on the two excitation forms 62, 64 above. In this way, dense, homogeneous, and hard $Al_2O_3$ layers are produced on the silicon, without pinholes and inclusions.

Figure 6:
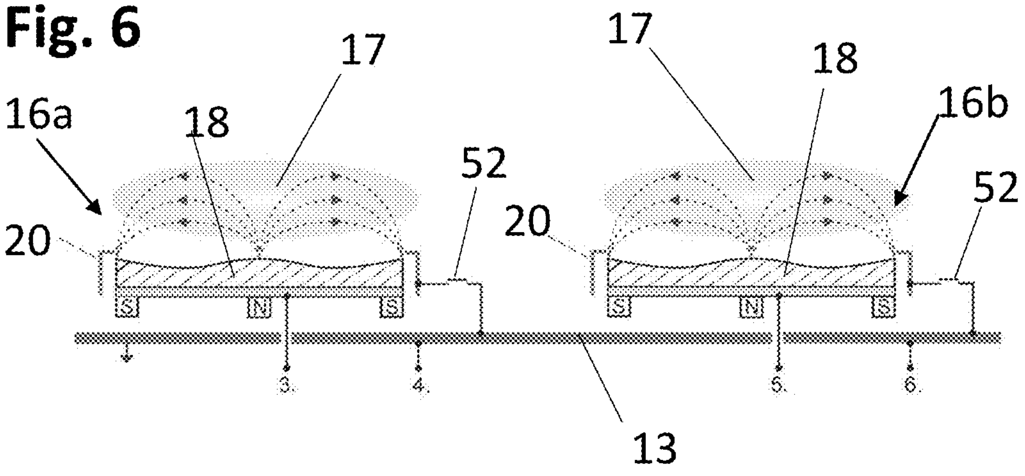
FIG. 6 shows a more detailed depiction of the dual magnetron of FIG. 2.

FIG. 6 shows a more detailed depiction of the dual magnetron with the two magnetrons 16*a* and 16*b* of FIG. 2. Also here, the switch 52 is more clearly seen to connect the anode ring 20 of the two magnetrons 16*a* and 16*b* to the material and the connectors 4 and 6 to the power supply 30*a*.

Figure 7:
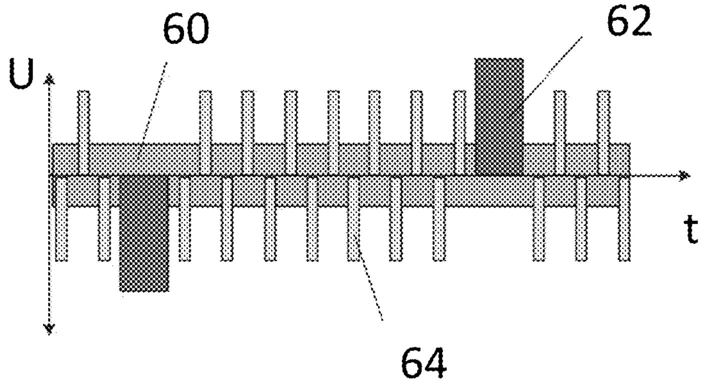
FIG. 7 shows a voltage/time diagram of the voltages emitted to a dual magnetron.
Figure 8:
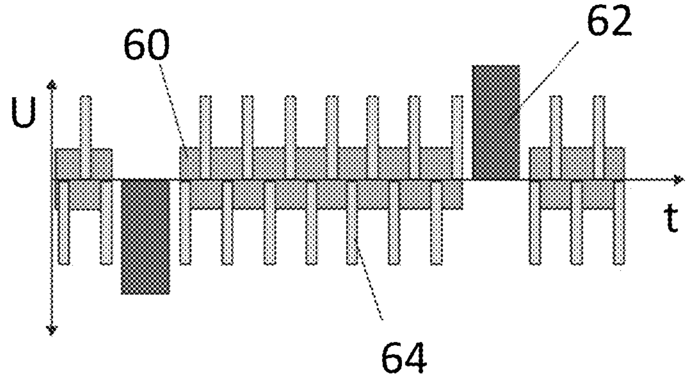
FIG. 8 shows a depiction according to FIG. 7 with three time-synchronized excitation forms.

FIG. 7 shows the output voltage, measured by the measuring system 40, of the power supply for both magnetrons comprising the high-frequency excitation 60, the HIPIMS impulses 62, and the medium frequency 64. Because of the fact that in the case of the pulse emissions, the cathode of the other magnetron is always used as reference potential, pulse patterns are produced here in both polar directions. FIG. 7 again shows the unsynchronized signals, while FIG. 8, analogously to FIG. 5, shows the synchronization to the extent that for the period of the HIPIMS impulses 62, the emission of the high-frequency excitation 60 and the medium-frequency excitation 64 is interrupted.

The invention is not limited to the depicted embodiment but rather can be varied within the scope of protection of the attached claims.

REFERENCE SYMBOL LIST

10 Magnetron sputtering unit with a magnetron
10*a* Magnetron sputtering unit with a dual magnetron
12 Deposition chamber under high vacuum
13 (Grounded) housing of the deposition chamber
14 Feed for sputtering gas (e.g., argon) and optionally for at least one reactive gas (e.g., oxygen)
16 Magnetron
16*a* First magnetron of a dual magnetron
16*b* Second magnetron of a dual magnetron
17 Plasma before the magnetron in the deposition chamber
18 (Target) cathode of the magnetron
18*a* (Target) cathode of the first magnetron of a dual magnetron
18*b* (Target) cathode of the second magnetron of a dual magnetron
20 (Switchable) ring anode around the cathode of the magnetron
22 Magnets of the magnetron on the back side of the cathode
24 Substrate holder
26 Optical emission spectrometer
28 Mass flow regulator
30 Power supply of the magnetron
30*a* Power supply of the two magnetrons of a dual magnetron
32 High-frequency generator
32*a* High-frequency generator of the power supply of the first magnetron of a dual magnetron
32*b* High-frequency generator of the power supply of the second magnetron of a dual magnetron
34 DC/pulse generator of the power supply
36 High-frequency filter
38 Adaptive network for impedance adaptation for the high-frequency supply into plasma
40 Measuring system for the output signal of the power supply
42 BIAS power supply
44 First connector of the BIAS power supply to the substrate holder
46 Second connector of the BIAS power supply to the material of the housing 13 of the deposition chamber
52 Switch for connecting the ring anode of the magnetron to the housing
60 First excitation form of the power supply (high frequency)
62 Second excitation form of the power supply (HIPIMS)
64 Third excitation form of the power supply (medium frequency)

The invention claimed is:

1. A method for depositing layers on a substrate by magnetron sputtering in a deposition chamber with use of a single magnetron that is connected to a power supply having high-frequency filters, to which an electrical supply voltage comprising three superimposed electrical excitation forms is applied, comprising a first excitation form, which is formed by a high frequency voltage with a frequency of 1 MHz to 10 GHz, a second excitation form in the form of high-power impulses (HIPIMS) with a frequency of 100 Hz to 5 kHz, and a third excitation form, formed by a pulsed d.c. voltage or a.c. voltage with a frequency of between 10 kHz and 100 kHz, wherein a reference potential for all three excitation forms is a ground potential.

2. The method according to claim 1, wherein at least two of the three excitation forms, preferably all three excitation forms, are fed in a time-synchronized manner.

3. The method according to claim 1, wherein the high-power impulses (HIPIMS) have a pulse length of more than 10 μs and a pulse power of between 15 kW and 10 MW.

4. The method according to claim 1, wherein a substrate carrier arranged in the deposition chamber is exposed to an electrical bias signal.

5. The method according to claim 4, wherein the bias signal is synchronized with at least one of the three excitation forms of the magnetron.

6. The method according to claim 4, wherein the bias signal comprises a DC signal, a high-frequency signal, and/or a pulse signal.

7. The method according to claim 6, wherein the pulse signal of the bias signal is time-delayed relative to the second excitation form.

8. The method according to claim 1, wherein short pre-pulses are emitted before the high-power impulses of the second excitation form in order to increase the ionization in the deposition chamber.

9. A magnetron sputtering unit for depositing layers on a substrate, comprising high-frequency filters, a deposition chamber, a substrate holder, and a single magnetron arranged in the deposition chamber, which is connected to at least one power supply, whose output emits three excitation forms to the single magnetron, comprising a first excitation form that is formed by a high-frequency voltage with a frequency of 1 MHz to 10 GHz, a second excitation form that is formed by high-power impulses (HIPIMS) with a frequency of 100 Hz to 5 kHz, and a third excitation form that is formed by a pulsed d.c. voltage or a.c. voltage with a frequency of between 10 kHz and 100 kHz, wherein a reference potential for all three excitation forms is a ground potential.

10. The magnetron sputtering unit according to claim 9, wherein the power supply for the provision of three excitation forms has separate generators.

11. The magnetron sputtering unit according to claim 9, wherein it has a synchronization system for synchronizing at least two of the three excitation forms.

12. The magnetron sputtering unit according to one of claim 11, wherein the substrate holder is isolated relative to the deposition chamber and is connected to at least one BIAS power supply.

13. The magnetron sputtering unit according to claim 12, wherein the synchronization system is designed to synchronize the BIAS power supply with the at least one power supply.

14. The magnetron sputtering unit according to claim 12, wherein the at least one BIAS power supply is designed to emit the following output voltages to the substrate holder: d.c. voltage, high-frequency a.c. voltage with a frequency of 1 MHz to 10 GHz, and/or high-power impulses with a frequency of 10 kHz to 100 kHz.

15. The magnetron sputtering unit according to one of claim 14, wherein the synchronization system is connected to at least one measuring circuit, which is connected to the outputs of the at least one power supply and optionally also to the output of the BIAS power supply, which measuring circuit of the synchronization system produces a correction signal for controlling the at least one power supply and optionally also the BIAS power supply.

* * * * *